(12) United States Patent
Campardo et al.

(10) Patent No.: US 7,592,849 B2
(45) Date of Patent: Sep. 22, 2009

(54) LEVEL SHIFTER FOR SEMICONDUCTOR MEMORY DEVICE IMPLEMENTED WITH LOW-VOLTAGE TRANSISTORS

(75) Inventors: Giovanni Campardo, Bergamo (IT); Rino Micheloni, Turate (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 163 days.

(21) Appl. No.: 11/725,988

(22) Filed: Mar. 19, 2007

(65) Prior Publication Data

US 2007/0241804 A1    Oct. 18, 2007

(51) Int. Cl.
*H03L 5/00* (2006.01)
(52) U.S. Cl. .............. 327/333; 326/80; 326/81
(58) Field of Classification Search .......... 327/333; 326/80, 81
See application file for complete search history.

(56) References Cited

U.S. PATENT DOCUMENTS

| | | | |
|---|---|---|---|
| 4,318,015 A | 3/1982 | Schade, Jr. et al. | |
| 4,404,659 A | 9/1983 | Kihara et al. | |
| 4,835,423 A | 5/1989 | de Ferron et al. | |
| 5,287,536 A | 2/1994 | Schreck et al. | |
| 5,321,287 A | 6/1994 | Uemura et al. | |
| 5,473,277 A | 12/1995 | Furumochi | |
| 5,736,869 A * | 4/1998 | Wei ............... | 326/81 |
| 5,748,025 A * | 5/1998 | Ng et al. ......... | 327/333 |
| 5,786,617 A | 7/1998 | Merrill et al. | |
| 5,796,656 A | 8/1998 | Kowshik et al. | |
| 5,907,171 A | 5/1999 | Santin et al. | |
| 6,002,290 A * | 12/1999 | Avery et al. ....... | 327/333 |
| 6,023,085 A | 2/2000 | Fang | |

(Continued)

FOREIGN PATENT DOCUMENTS

EP    0576774    1/1994

(Continued)

OTHER PUBLICATIONS

European Search Report for EP 05 11 1284 dated Mar. 27, 2006.

(Continued)

*Primary Examiner*—Kenneth B. Wells
(74) *Attorney, Agent, or Firm*—Kevin D. Jablonski; Graybeal Jackson LLP (57) ABSTRACT

A level shifter is proposed. The level shifter includes a stage having a first branch and a second branch, each branch including: a selection terminal for receiving a selection signal, the selection signal received by the first branch and the second branch being alternatively at a first voltage and at a second voltage higher than the first voltage in absolute value, a service terminal for receiving a third voltage higher than the second voltage in absolute value, an input circuit for coupling an intermediate node to the selection terminal when at the second voltage or for insulating the intermediate node from the selection terminal otherwise, an interface circuit for coupling an output terminal to the intermediate node when coupled or for insulating the output terminal from the intermediate node otherwise, and an output circuit for insulating the service terminal from the output terminal when coupled or for coupling the service terminal to the output terminal otherwise, the output terminals of the first branch and the second branch providing an output signal being alternatively at the second voltage or at the third voltage according to the selection signal.

32 Claims, 4 Drawing Sheets

U.S. PATENT DOCUMENTS

| | | | |
|---|---|---|---|
| 6,111,425 | A | 8/2000 | Bertin et al. |
| 6,351,173 | B1 | 2/2002 | Ovens et al. |
| 6,370,071 | B1 * | 4/2002 | Lall et al. ............... 365/205 |
| 6,407,579 | B1 * | 6/2002 | Goswick .................. 326/81 |
| 6,410,387 | B1 | 6/2002 | Cappelletti et al. |
| 6,417,716 | B1 * | 7/2002 | Riccio .................... 327/333 |
| 6,487,687 | B1 * | 11/2002 | Blake et al. ............. 714/724 |
| 6,518,816 | B2 * | 2/2003 | Riccio et al. ............ 327/333 |
| 6,556,047 | B2 * | 4/2003 | Debaty .................... 326/68 |
| 6,639,427 | B2 * | 10/2003 | Dray et al. ............... 326/83 |
| 6,741,115 | B2 * | 5/2004 | Lundberg ................ 327/333 |
| 6,806,540 | B2 | 10/2004 | Watanabe et al. |
| 7,053,657 | B1 * | 5/2006 | Peng ....................... 326/68 |
| 7,053,658 | B1 * | 5/2006 | Blankenship et al. ..... 326/81 |
| 7,075,140 | B2 | 7/2006 | Spadea |
| 7,095,651 | B2 | 8/2006 | Shirota et al. |
| 7,129,752 | B2 * | 10/2006 | Bayer ...................... 326/68 |
| 7,151,391 | B2 * | 12/2006 | Chen et al. ............... 326/68 |
| 7,154,789 | B2 | 12/2006 | Kim et al. |
| 7,183,817 | B2 * | 2/2007 | Sanchez et al. .......... 327/112 |
| 7,215,146 | B2 * | 5/2007 | Khan ....................... 326/83 |
| 2001/0020840 | A1 | 9/2001 | Kojima |
| 2002/0030204 | A1 | 3/2002 | Hirano |
| 2002/0041000 | A1 | 4/2002 | Watanabe et al. |
| 2003/0011418 | A1 | 1/2003 | Nishimura et al. |
| 2003/0032242 | A1 | 2/2003 | Lee et al. |
| 2003/0042971 | A1 | 3/2003 | Oikawa et al. |
| 2004/0017722 | A1 | 1/2004 | Cavaleri et al. |
| 2004/0232511 | A1 | 11/2004 | Fujio et al. |
| 2007/0147141 | A1 | 6/2007 | Shibata |

FOREIGN PATENT DOCUMENTS

| | | |
|---|---|---|
| EP | 0 608 489 A | 8/1994 |
| EP | 0 921 627 A | 6/1999 |
| EP | 1791245 | 5/2007 |
| EP | 1835507 | 9/2007 |
| EP | 1837880 | 9/2007 |
| EP | 1892600 | 2/2008 |
| WO | 9705696 | 2/1997 |

OTHER PUBLICATIONS

European Search Report for EP 06 11 1477 dated Jul. 26, 2006.
European Search Report for EP 06 11 1337 dated Aug. 25, 2006.
European Search Report for Application Serial No. EP 06113480, European Patent Office, Nov. 29, 2006.
European Search Report for Application Serial No. EP 06119456, European Patent Office, Jan. 31, 2007.

* cited by examiner

LEVEL SHIFTER FOR SEMICONDUCTOR MEMORY DEVICE IMPLEMENTED WITH LOW-VOLTAGE TRANSISTORS

PRIORITY CLAIM

This application claims priority from European patent application No. EP06111337.9, filed Mar. 17, 2006, which is incorporated herein by reference.

CROSS REFERENCE TO RELATED APPLICATION

This application is related to U.S. patent application Ser. No. 11/605,209, filed on Nov. 27, 2006, which has a common filing date and owner and which is incorporated by reference.

TECHNICAL FIELD

An embodiment of the present invention relates generally to the semiconductor memory device field, and more specifically to level shifters.

BACKGROUND

Semiconductor memory devices are commonly used to store information (either temporarily or permanently) in a number of applications; particularly, in a non-volatile memory device the information is preserved even when a power supply is off. Typically, the memory device includes a matrix of memory cells that are arranged in a plurality of rows (connected to corresponding word lines) and in a plurality of columns (connected to corresponding bit lines).

For example, flash memory devices are a particular type of non-volatile memory device, in which each memory cell is formed by a floating gate MOSFET transistor. Each memory cell has a threshold voltage (which depends on the electric charge stored in the corresponding floating gate), which can be programmed to different levels representing corresponding logical values. Particularly, in a multi-level flash memory device each memory cell can take more than two levels (and then store a plurality of bits).

In order to retrieve and/or store information, the flash memory device includes a decoding system that is adapted to decode an addressing code identifying a group of memory cells. In particular, the decoding system includes a row selector for selecting a corresponding word line and a column selector for selecting a corresponding set of bit lines. These selectors operate with logical signals at low voltages, of the order of a supply voltage of the flash memory device (such as 3V); for example, the logical signals can take two values equal to a reference voltage (0) or to the supply voltage (1).

However, the decoding system often must be able to apply operative voltages of high value to the selected memory cells (during program and erase operations). These voltages (for example, ranging from −9V to 9V) are higher than the supply voltage (in absolute value). For example, in single supply voltage memory devices, the high voltages are generated inside the flash memory device from the supply voltage, by means of suitable circuits (such as, charge pumps).

For this purpose, the decoding system includes level shifters, which are adapted to convert the logical signals from the selectors into the high voltages necessary during the program and erase operations; for example, during a program operation the level shifters shift the supply voltage used for selecting the desired word line to a program voltage to be applied thereto (such as, 9V).

Therefore, the selectors can be implemented with low voltage components that are designed in such a way to be able to sustain (between their terminals) voltage differences that are limited (in absolute value) by the supply voltage. Indeed, the low voltages that are experienced by those components allow their correct functioning, without causing breaking thereof. For example, those components are low-voltage MOSFET transistors, which are designed in such a way to avoid the occurrence of gate oxide breakdown or undesired junction breakdown when low voltage differences are applied to their terminals (for example, between the gate and source terminals).

Conversely, the level shifters typically must include high-voltage components that are designed in such a way to be able to sustain (between their terminals) voltage differences that are higher than the supply voltage (up to 9V in the case at issue). For example, those components are high-voltage MOSFET transistors, which are designed in such a way to avoid the occurrence of gate oxide breakdown or undesired junction breakdown even when high voltages are applied to their terminals.

The high-voltage transistors have a gate oxide layer thicker than that used for the low voltage transistors. Indeed, the thicker the gate oxide layer the higher the voltage sustained at their terminals without undesired breakdown. Since the high-voltage transistors typically occupy more silicon area compared to the low-voltage transistors, the level shifters may waste a significant area of a chip wherein the flash memory device is integrated.

This problem is more evident with the increment of the number of word lines included in the flash memory device.

Moreover, the use of both low- and high-voltage transistors often increases the number of processing steps and masks (for example, for differentiating the oxide thickness of the high- and low-voltage transistors); this may have a detrimental impact on the manufacturing process of the flash memory device.

SUMMARY

An embodiment of the present invention is based on the idea of using components working at reduced voltage.

In detail, an embodiment of the present invention proposes a level shifter. The level shifter includes a stage having a first branch and a second branch. Each branch includes a selection terminal for receiving a selection signal; the selection signal received by the first branch and the second branch is alternatively at a first voltage and at a second voltage (higher than the first voltage in absolute value). The branch also includes a service terminal for receiving a third voltage (higher than the second voltage in absolute value). An input circuit is used for coupling an intermediate node to the selection terminal when at the second voltage, or for insulating the intermediate node from the selection terminal otherwise. The branch further includes an interface circuit for coupling an output terminal to the intermediate node when coupled or for insulating the output terminal from the intermediate node otherwise. At the end, an output circuit is used for insulating the service terminal from the output terminal when coupled, or for coupling the service terminal to the output terminal otherwise. The output terminals of the first branch and the second branch provide an output signal, which is alternatively at the second voltage or at the third voltage according to the selection signal.

In an embodiment of the invention, the input circuit of each branch includes an input transistor between the intermediate node and the selection terminal.

In a further embodiment of the invention, the interface circuit includes an interface transistor between the intermediate node and the output terminal.

Advantageously, the interface transistor is biased for its turning on.

In a further embodiment of the invention, the output circuit of each branch includes an output transistor between the output terminal and the service terminal.

The level shifter may have two or more stages that are cascade connected.

The level shifter may be implemented by means of low voltage transistors.

In an embodiment of the invention, the input and output transistors are of a first type of conductivity (such as p-channel MOSFET transistors) and the interface transistors are of the opposite type of conductivity (such as n-channel MOSFET transistors).

An embodiment is applied to a non-volatile memory device.

Another embodiment of the present invention is a corresponding method.

BRIEF DESCRIPTION OF THE DRAWINGS

One or more embodiments of the invention, as well as features and advantages thereof, may be understood by reference to the following detailed description, given purely by way of a non-restrictive indication, to be read in conjunction with the accompanying drawings.

DETAILED DESCRIPTION

Figure 1:
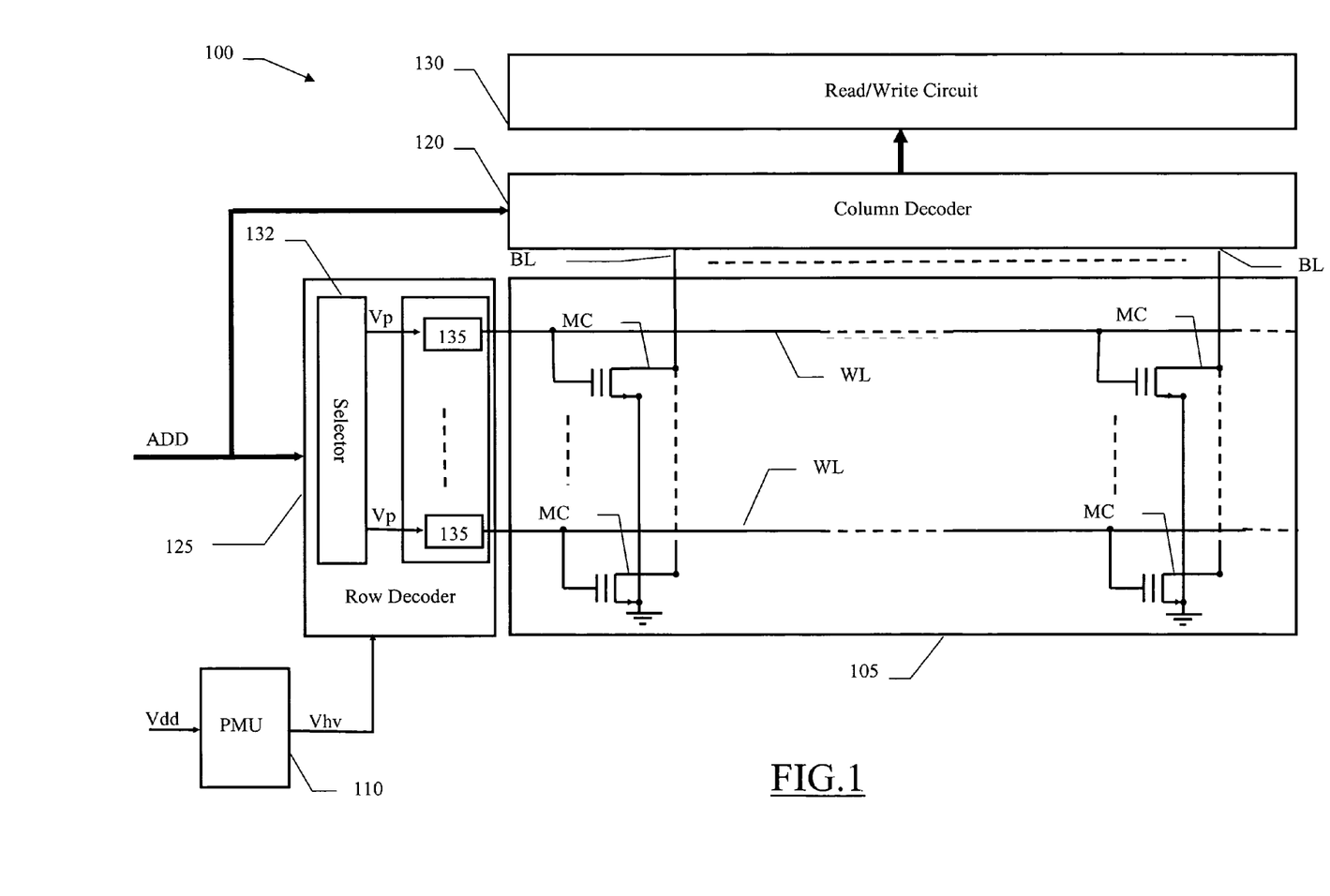
FIG. 1 is a schematic block diagram of a memory device in which the solution according to an embodiment of the invention can be used.

Referring to FIG. 1, a flash memory device 100 is represented. The memory device 100 includes one or more sectors 105 (only one shown). The sector 105 include a plurality of memory cells MC, each one including a floating-gate MOSFET transistor. In particular, the memory device 100 is of the flash type, wherein the memory cells MC of each sector 105 are erased at the same time.

In an erased condition, each memory cell MC has a low threshold voltage (to which a logical level "1" is typically associated). The memory cell MC is programmed by injecting electrons into its floating-gate; in this condition the memory cell MC has a high threshold voltage (to which a logical level "0" is typically associated).

In each sector 105, the memory cells MC are arranged in rows and columns. The memory cells MC of each column have the drain terminals connected to a respective bit line BL, while the memory cells MC of each row have the gate terminals connected to a respective word line WL. The source terminal of each memory cell MC receives a reference voltage GND (or ground).

The memory device 100 further includes a PMU (acronym for Power Management Unit) 110. The PMU 110 provides the biasing voltages that are used for performing the conventional operations (such as read, program, erase and verify) on the memory device 100. The PMU 110 receives a supply voltage Vdd (such as 3V) externally and outputs different operative voltages Vhv; the operative voltages Vhv are generally higher in absolute value than the supply voltage Vdd, for example, ranging from −9V to 9V. For this purpose, the PMU 110 includes a circuitry (e.g., charge pumps) adapted to generate the operative voltages Vhv from the supply voltage Vdd. These charge pumps may be implemented by means of low voltage transistors only, as described in U.S. patent application Ser. No. 11/605,209, filed on Nov. 27, 2006 (the entire disclosure of which is previously incorporated by reference).

Moreover, the memory device 100 receives an addressing code ADD for accessing the memory cells MC. The addressing code ADD includes a logical signal formed by a set of bits (such as 8-32); each bit may be at the supply voltage Vdd (for example, logical level "1") or at the ground voltage GND (for example, logical level "0"). A portion of the addressing code ADD is supplied to a column decoder 120, which selects a set of desired bit lines BL (such as 8). Another portion of the addressing code ADD is supplied to a row decoder 125, which selects one desired word line WL.

The column decoder 120 couples the selected bit lines BL to a read-write circuit 130. The read/write circuit 130 includes all the components (e.g., sense amplifiers, comparators, reference current/voltage generators, pulse generators, program load circuits and the like), which are normally required for writing the desired logical values into the selected memory cells MC and for reading the logical values currently stored therein. The read/write circuit 130 is coupled to externally-accessible terminals of the memory device 100 (not shown in FIG. 1) for receiving/delivering data.

The row decoder 125 includes a selector 132, which receives the corresponding portion of the addressing code ADD and provides a (logical) selection signal Vp for each word line WL; for example, the selection signal Vp of the selected word line WL is asserted (at the logical value 1) whereas the other selection signals Vp are deasserted (at the logical value 0). Each selection signal Vp is provided to a corresponding level shifter 135. The level shifter 135 converts the logical value of the selection signal Vp (GND-Vdd) to one of the operative voltages Vhv (from −9V to 9V, according to the operations to be performed on the memory device 100).

Figure 2:
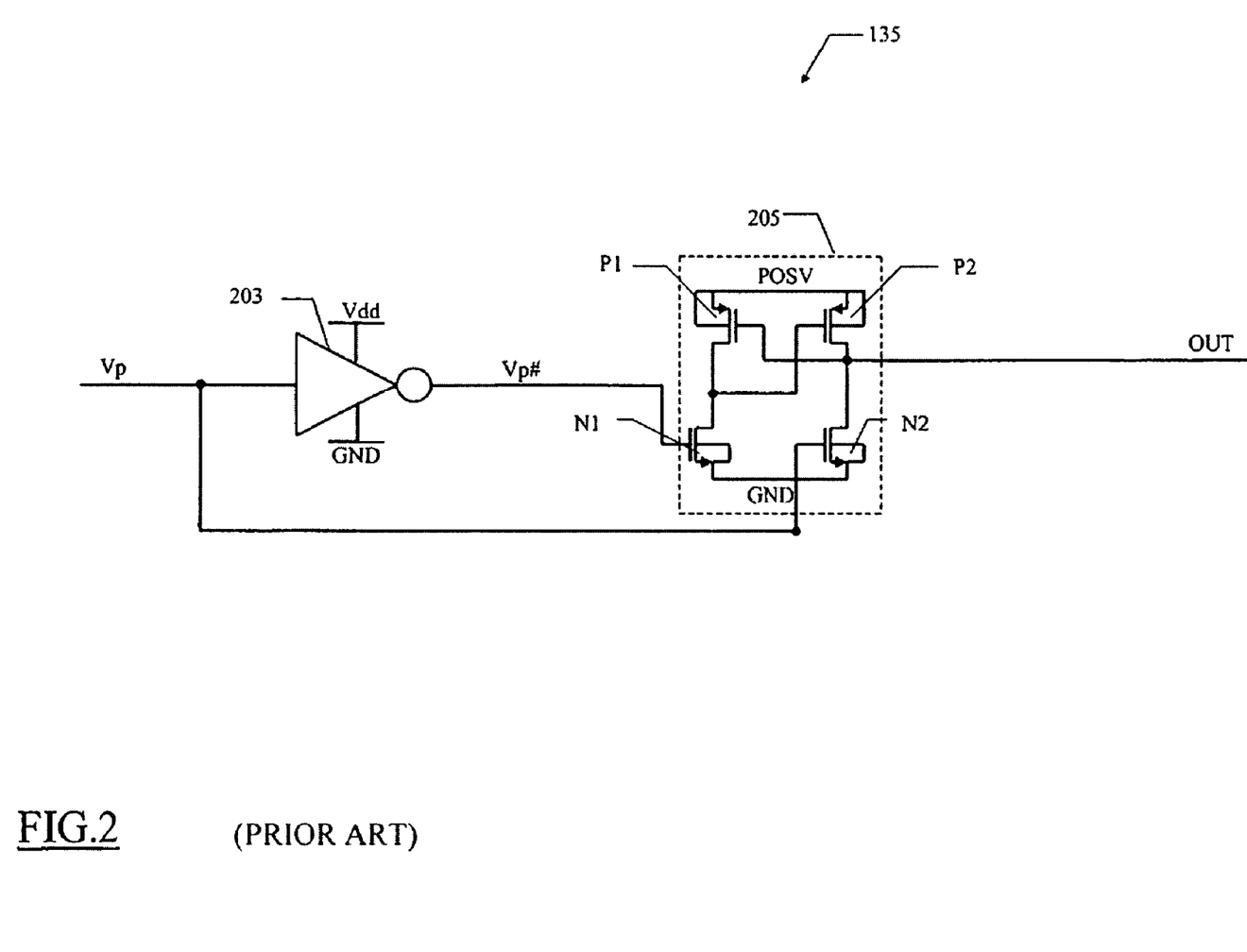
FIG. 2 is an exemplary implementation of a level shifter known in the art.

Referring to FIG. 2, a schematic representation of a generic level shifter 135 known in the art is shown. The level shifter 135 includes an inverter 203, for example of CMOS type, and a shifter circuit 205. The inverter 203 is supplied between the voltages Vdd and GND. The inverter 203 receives the selection signal Vp from the selector (not shown in the figure) and provides a corresponding complemented selection signal Vp# to the shifter circuit 205. The shifter circuit 205 has a latch structure that includes two p-channel MOSFET transistors P1 and P2 and two n-channel MOSFET transistors N1 and N2. The transistors P1 and P2 have the source terminals that receive one of the operative voltages Vhv, such as a program voltage POSV (for example, POSV=9V). The transistors N1 and N2 have the corresponding drain terminals that are connected to the drain terminals of the transistors P1 and P2, respectively. The gate terminal of the transistor P1 is connected to the drain terminal of the transistor P2, which provides an output signal OUT to the corresponding word line (not shown in the figure); the gate terminal of the transistor P2 is connected to the drain terminal of the transistor P1.

The transistors N1 and N2 have the source terminals that receive the reference voltage GND. The gate terminal of the transistor N2 directly receives the selection signal Vp. The transistor N1 has the gate terminal that receives the complemented selection signal Vp# from the inverter 203.

When the selection signal Vp is asserted (at the supply voltage Vdd) the complemented selection signal Vp# is deasserted (at the reference voltage GND). In this biasing condition, the transistor N2 is on. Therefore, the output signal OUT is brought to the reference voltage GND.

At the same time, the transistor N1 is off. As a result, the transistor P1 is on (because its gate terminal receives the reference voltage GND by means of the transistor N2). However, the transistor P1 is connected in series to the transistor N1, thus both the transistors N1 and P1 cannot conduct any current because the transistor N1 is off. The transistor P1 has the drain terminal that is brought to the program voltage POSV. In this biasing condition, the transistor P2 is also off, so as not to interfere with the output signal OUT.

On the contrary, when the selection signal Vp is deasserted and the complemented selection signal Vp# is asserted, the transistor N1 is on and the transistor N2 is off. In this way, the transistor P2 is turned on and the transistor P1 is turned off, so as to bring the output signal OUT to the program voltage POSV.

In the level shifter 135 the driving voltage of the transistors N1 and N2 (between the gate and source/drain terminals) may reach the program voltage POSV=9V, when they are driven (at the gate terminals) by the reference voltage GND and receive the program voltage POSV at the drain terminals (through the transistors P2 and P1, respectively). Likewise, the driving voltage of the transistors P1 and P2 may reach the program voltage POSV=9V, when they are driven by the reference voltage GND (through the transistors N1 and N2, respectively). Thus, the driving voltage of the transistors N1, N2, P1 and P2 is higher than the supply voltage Vdd. The transistors P1, P2, N1 and N2 are then designed in such a way to guarantee the capability of sustaining, between their gate terminal and any other terminal thereof, voltage differences up to the program voltage POSV.

For this purpose, the transistors P1, P2, N1 and N2 have a thick gate oxide layer. In other words, the transistors P1, P2, N1 and N2 are high-voltage transistors (with the drawbacks previously discussed).

Figure 3:
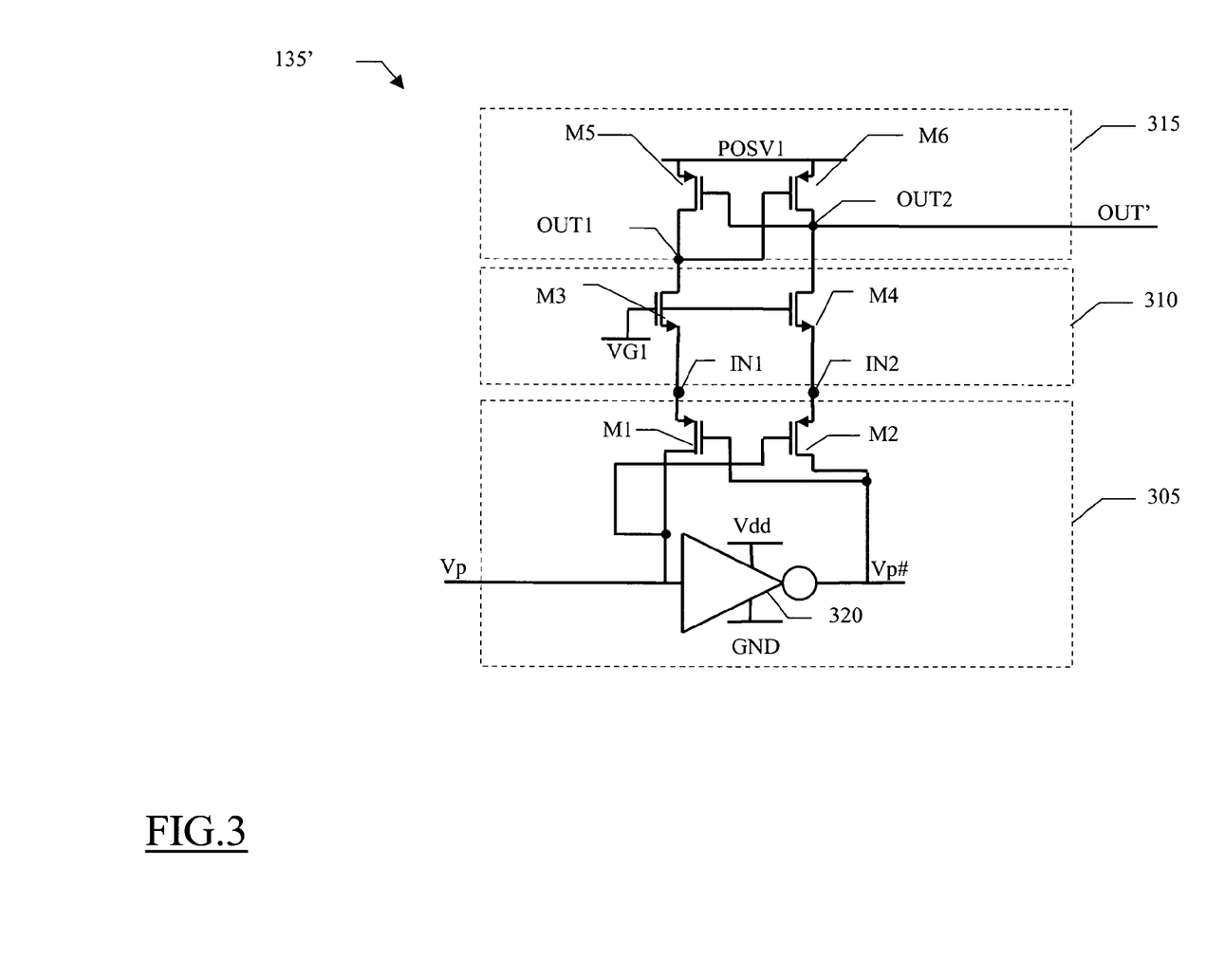
FIG. 3 shows a level shifter according to an embodiment of the invention.

Referring now to FIG. 3, a level shifter according to an embodiment of the present invention is schematically shown (this implementation is differentiated by adding an apex to its reference, i.e., 135').

In particular, the level shifter 135' includes an input circuit 305 that is coupled to an interface circuit 310. The interface circuit 310 is in turn coupled to an output circuit 315.

More in detail, the input circuit 305 includes two p-channel MOSFET transistors M1 and M2 and an inverter 320, which is supplied between the voltages Vdd and GND. As above, the inverter 320 receives the selection signal Vp and provides the complemented selection signal Vp#.

The gate terminal of the transistor M2 receives the selection signal Vp and the gate terminal of the transistor M1 receives the complemented selection signal Vp# (through the inverter 320). The drain terminal of the transistor M2 is connected to the gate terminal of the transistor M1, and the gate terminal of the transistor M2 is connected to the drain terminal of the transistor M1.

The source terminals of the transistors M1 and M2 (denoted as intermediate nodes IN1 and IN2, respectively) are connected to the interface circuit 310. In particular, the interface circuit 310 includes two n-channel MOSFET transistors M3 and M4. The transistors M3 and M4 have the source terminals connected to the intermediate nodes IN1 and IN2, respectively, and the drain terminals that are connected to the output circuit 315 (denoted as output nodes OUT1 and OUT2, respectively). Moreover, the gate terminals of the transistors M3 and M4 are connected together and receive a predetermined gate voltage VG1. The gate voltage VG1 is higher than the supply voltage Vdd; more specifically, in one embodiment, the gate voltage VG1 is at least equal to the supply voltage Vdd plus a typical threshold voltage of the transistors M3 and M4, such as VG1=3V+1V=4V. For example, the gate voltage VG1 is provided by means of a voltage regulator which is included in the PMU of the memory device.

The output circuit 315 has a latch structure as in FIG. 2, which is implemented by two p-channel MOSFET transistors M5 and M6 (with the node OUT2 that provides a different output signal OUT'). In this case, the source terminals of the transistors M5 and M6 receive one of the operative voltages Vhv (denoted with POSV1), which is equal at most to twice the supply voltage Vdd (for example, POSV=6V).

In other words, the level shifter 135' has first and second circuital branches, wherein the first branch includes the transistors M1, M3, M5 (connected in series) and the second branch includes the transistors M2, M4 and M6 (connected in series).

During operation of the level shifter 135', when the selection signal Vp is asserted (at the supply voltage Vdd), the complemented selection signal Vp# is deasserted (at the reference voltage GND). In this biasing condition, the transistor M1 is on. Thus, the transistor M1 brings the intermediate node IN1 to the supply voltage Vdd. The transistor M3 is turned on as well. In this way, the voltage of the output node OUT1 reaches the supply voltage Vdd. As a result, the transistor M6 is turned on and the output node OUT2 is brought to the operative voltage POSV1.

In this biasing condition, the transistor M5 is off (because its driving voltage is equal to zero), so that the output node OUT1 remains at the supply voltage Vdd. Since the transistor M2 is off, the transistor M4 cannot conduct any current as well.

On the contrary, when the selection signal Vp is deasserted (at the reference voltage GND), the transistors M2, M4 and M5 are turned on and the transistors M1, M3 and M6 are turned off, so as to bring the output node OUT2 to the supply voltage Vdd (with the output node OUT1 that is at the operative voltage POSV1).

As can be noted, during the operation of the level shifter 135', each transistor M1-M6 sustains (between its gate terminal and any other terminal thereof) voltage differences at most equal to the supply voltage Vdd.

Particularly, thanks to the interface circuit 310, when the transistors M5 and M6 are on they are driven by the supply voltage Vdd (and not by the reference voltage GND as in the preceding case); therefore, their driving voltage remains equal to POSV1−Vdd and then at most equal to Vdd (being POSV1≦2Vdd). Likewise, when the transistors M1 and M2 are off they receive the supply voltage Vdd at the drain terminals through the transistors M3 and M4, respectively (instead of the operative voltage POSV1).

In such a way, the level shifter 135' can be implemented with only low-voltage transistors.

Therefore, it is possible to avoid the use of high-voltage transistors having thick oxide layers (capable of sustaining voltages higher than the supply voltage Vdd). This may reduce the area occupied by the memory device in a chip of semiconductor material where it is integrated.

Moreover, the number of processing steps and masks may be reduced significantly: this may have a beneficial impact on the whole manufacturing process of the memory device.

However, in the level shifter 135', if the operative voltages were higher than 2Vdd, the transistors M5 and M6 might experience driving voltages higher than the supply voltage Vdd (so that they might not be implementable with low-voltage transistors).

Figure 4:
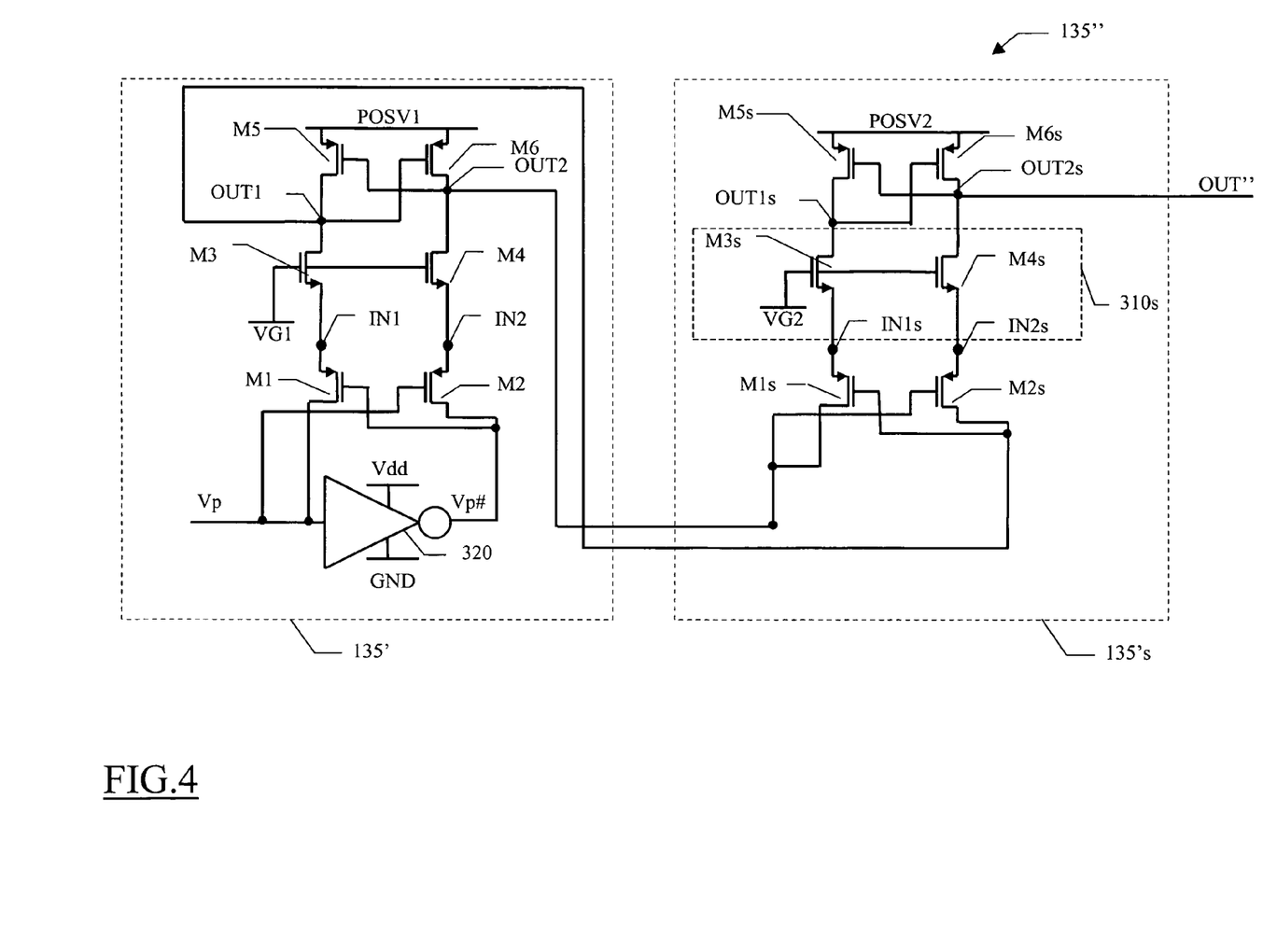
FIG. 4 shows a level shifter according to a further embodiment of the invention.

In order to overcome this limitation, a level shifter according to a further embodiment of the present invention is proposed in FIG. 4 (this implementation is differentiated by adding a double apex to its reference, i.e., 135").

In particular, the level shifter 135" includes the level shifter 135' described above and a further (simplified) level shifter (which is differentiated by adding the index 's' to its references). The simplified level shifter 135's has a circuital structure as the one of level shifter 135' except for the lack of the inverter 320. The level shifter 135' and the level shifter 135's are cascade connected. More in particular, the gate terminal of the transistor M1s is coupled to the output node OUT1 and the gate terminal of the transistor M2s is coupled to the output node OUT2.

Moreover, all the voltages applied to the transistors M1s-M6s are increased by the supply voltage Vdd. In detail, the transistors M1s and M2s are now driven alternatively by the supply voltage Vdd or the operative voltage POSV1 (provided by the level shifter 135'). Moreover, the transistors M3s and M4s receive a gate voltage VG2 that is equal to the operative voltage POSV1 plus their threshold voltage, such as VG2=6V+1V=7V. Likewise, the source terminals of the transistors M5s and M6s receive one of the operative voltages Vhv (denoted with POSV2), which is equal at most to three times the supply voltage Vdd (for example, POSV2=9V).

In this case, the output node OUT2s provides a higher output signal OUT" to the corresponding word line (not shown in the figure).

As described above, when the selection signal Vp is asserted (at the supply voltage Vdd), the output node OUT1 is at the supply voltage Vdd whereas the output node OUT2 is at the operative voltage POSV1. The operation of the level shifter 135s' is the same of the level shifter 135', with the only difference that its voltages are shifted by the supply voltage Vdd. Particularly, in this biasing condition the transistor M1s is on, so bringing the intermediate node IN1s to the operative voltage POSV1. The transistor M3s is turned on as well. In this way, the voltage of the output node OUT1s reaches the operative voltage POSV1. As a result, the transistor M6s is turned on and the output node OUT2s is brought to the operative voltage POSV2.

In this biasing condition, the transistor M5s is off (because its driving voltage is equal to zero), so that the output node OUT1s remains at the operative voltage POSV1. Since the transistor M2s is also off, the transistor M4s cannot conduct any current.

On the contrary, when the selection signal Vp is deasserted (at the reference voltage GND), the transistors M2s, M4s and M5s are turned on and the transistors M1s, M3s and M6s are turned off, so as to bring the output node OUT2s (and thus the output signal OUT") to the operative voltage POSV1 (with the output node OUT1s that is at the operative voltage POSV2).

As can be noted, during the operation of the level shifter 135", each transistor M1s-M6s sustains (between its gate terminal and any other terminal thereof) voltage differences at most equal to the supply voltage Vdd.

Particularly, when the transistors M5s and M6s are on they are driven by the operative voltage POSV1; therefore, their driving voltage remains equal to POSV2−POSV1 and then at most equal to Vdd (being POSV1=2Vdd and POSV2=3Vdd). Likewise, when the transistors M1s and M2s are off they receive the supply voltage Vdd at their gate terminals and the operative voltage POSV1 at their drain terminals (which difference is again at most equal to Vdd).

Therefore, it is now possible to shift the selection signal Vp (GND−Vdd) to a higher output signal OUT" (POSV1−POSV2) again using only low-voltage transistors. The same structure proposed above can be replicated by adding further stages, so as to work with operative voltages up to 4Vdd with 3 stages, 5Vdd with 4 stages, and so on.

Naturally, in order to satisfy local and specific requirements, a person skilled in the art may apply to the solution described above many modifications and alterations. Particularly, although the present invention has been described with a certain degree of particularity with reference to embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the level shifter has a similar structure even implemented with equivalent components. Moreover, it should be apparent that the numerical examples of the different voltages described above are merely illustrative and must not to be interpreted in a limitative manner.

Likewise, the input circuit, interface circuit and/or output circuit may have alternative schemes; for example, it is possible to implement the interface circuit with two or more transistors connected in series.

In any case, the use of other types of transistors (for example, bipolar junction transistors) is within the scope of the invention.

Moreover, the use of MOSFET transistor having a type of conductivity opposed to that of the transistors shown in the preceding description is contemplated (so as to work with negative voltages).

Similar considerations apply if the memory device has a different structure or includes equivalent components.

Likewise, it is possible to use the proposed solution for biasing the selected word lines during further operations performed on the memory device.

It should be noted that although in the preceding description reference has been made to the row decoder, this is not to be intended as a limitation; indeed, the same techniques can also be used for implementing a column decoder adapted for biasing the selected bit lines.

An electronic system, such as a computer system, may incorporate the memory device 100 of FIG. 1, and may incorporate one or more other devices, such as a controller, coupled to the memory device.

From the foregoing it will be appreciated that, although specific embodiments of the invention have been described herein for purposes of illustration, various modifications may be made without deviating from the spirit and scope of the invention.

What is claimed is:

1. A level shifter including a stage having a first branch and a second branch, each branch including:
    a selection terminal coupled to each branch for receiving a selection signal, the selection signal received by the first branch and the second branch being alternatively at a first voltage and at a second voltage higher than the first voltage in absolute value,
    a service terminal for receiving a third voltage higher than the second voltage in absolute value,
    an input circuit for electrically coupling an intermediate node to the selection terminal if the second voltage is detected at the selection terminal or for insulating the intermediate node from the selection terminal otherwise, an interface circuit for coupling an output terminal to the intermediate node if the second voltage is detected at the selection terminal or for insulating the output terminal from the intermediate node otherwise, and an output circuit for insulating the service terminal from the output terminal when coupled or for coupling the service terminal to the output terminal otherwise, the output terminals of the first branch and the second branch providing an output signal being alternatively at the second voltage or at the third voltage according to the selection signal.

2. The level shifter according to claim 1, wherein in each branch the input circuit includes an input transistor having a first conduction terminal coupled to the intermediate node of the branch, a second conduction terminal coupled to the selection terminal of the branch, and a control terminal coupled to the selection terminal of the other branch.

3. The level shifter according to claim 1, wherein in each branch the interface circuit includes an interface transistor having a first conduction terminal coupled to the intermediate node, a second conduction terminal coupled to the output terminal, and a control terminal for receiving a biasing voltage comprised between the second voltage and the third voltage.

4. The level shifter according to claim 3, wherein the interface transistor has a predefined threshold voltage, the biasing voltage being at least equal to the second voltage plus the threshold voltage.

5. The level shifter according to claim 1, wherein in each branch the output circuit includes an output transistor having a first conduction terminal coupled to the service terminal of the branch, a second conduction terminal coupled to the output terminal of the branch, and a control terminal coupled to the output terminal of the other branch.

6. The level shifter according to claim 1, wherein the level shifter includes at least one further stage, all the stages being cascade connected in a sequence, and wherein for each next stage different from a first stage in the sequence each selection terminal is coupled to the corresponding output terminal of a preceding stage in the sequence.

7. The level shifter according to claim 1, wherein for each stage the difference between the second voltage and the first voltage and the difference between the third voltage and the second voltage is at most equal to a power supply voltage, each transistor being a low-voltage transistor adapted to sustain at most the power supply voltage between each pair of terminals thereof.

8. The level shifter according to claim 7, wherein each transistor is a MOSFET transistor, the input transistors and the output transistors having a first type of conductivity and the interface transistors having a second type of conductivity, the second type of conductivity being opposite to the first type of conductivity.

9. A memory device comprising:
a plurality of memory cells arranged in at least one plurality of alignments, for each plurality of alignments the memory device including means for providing a selection signal for each alignment in response to an address code, and
a level shifter coupled to the memory cells including:
a selection terminal coupled to a first branch and a second branch for receiving a selection signal, the selection signal received by a first branch and a second branch being alternatively at a first voltage and at a second voltage higher than the first voltage in absolute value, a service terminal for receiving a third voltage higher than the second voltage in absolute value,
an input circuit for electrically coupling an intermediate node to the selection terminal if the second voltage is detected at the selection terminal or for insulating the intermediate node from the selection terminal otherwise,
an interface circuit for coupling an output terminal to the intermediate node if the second voltage is detected at the selection terminal or for insulating the output terminal from the intermediate node otherwise, and
an output circuit for insulating the service terminal from the output terminal when coupled or for coupling the service terminal to the output terminal otherwise, the output terminals of the first branch and the second branch providing an output signal being alternatively at the second voltage or at the third voltage according to the selection signal.

10. A level shifting method implemented by a level shifter including a stage having a first branch and a second branch, the method including the steps of:
receiving a selection signal at a selection terminal that is coupled to each branch, the selection signal received by the first branch and the second branch being alternatively at a first voltage and at a second voltage higher than the first voltage in absolute value,
receiving a third voltage at a service terminal higher than the second voltage in absolute value,
electrically coupling an intermediate node to the selection terminal when the selection terminal is at the second voltage or insulating the intermediate node from the selection terminal otherwise,
coupling an output terminal to the intermediate node when coupled or insulating the output terminal from the intermediate node otherwise, and
insulating the service terminal from the output terminal when coupled or coupling the service terminal to the output terminal otherwise, the output terminals of the first branch and the second branch providing an output signal being alternatively at the second voltage or at the third voltage according to the selection signal.

11. A level shifter, comprising:
a first input stage having first and second differential input nodes, first and second differential output nodes, and a first transistor having a first conduction node electrically coupled to the first input node, a second conduction node coupled to the first output node, and a control node coupled to the second input node;
a first cascode stage having first and second differential input nodes coupled to the first and second output nodes of the input stage, having first and second differential output nodes, and having a first bias node; and
a first output stage having first and second differential nodes coupled to the first and second output nodes of the cascode stage, having a first supply node, and operable to generate a differential output signal across the first and second differential nodes.

12. The level shifter of claim 11 wherein the input stage further comprises an inverter having an input node coupled to the first input node of the input stage and having an output node coupled to the second input node of the input stage.

13. The level shifter of claim 11 wherein the input stage comprises:
an inverter having an input node coupled to the first input node of the input stage and having an output node coupled to the second input node of the input stage;

wherein the first transistor comprises a first MOS transistor; and a second MOS transistor having a first conduction node coupled to the output node of the inverter, a second conduction node coupled to the second output node of the input stage, and a gate coupled to the first input node of the input stage.

14. The level shifter of claim 11 wherein the input stage comprises:
an inverter having an input node coupled to the first input node of the input stage and having an output node coupled to the second input node of the input stage;
wherein the first transistor comprises a first PMOS transistor; and
a second PMOS transistor having a drain coupled to the output node of the inverter, a source coupled to the second output node of the input stage, and a gate coupled to the first input node of the input stage.

15. The level shifter of claim 11 wherein the cascode stage comprises:
a first transistor having a first conduction node coupled to the first input node of the cascode stage, a second conduction node coupled to the first output node of the cascode stage, and a control node coupled to the bias node; and
a second transistor having a first conduction node coupled to the second input node of the cascode stage, a second conduction node coupled to the second output node of the cascode stage, and a control node coupled to the bias node.

16. The level shifter of claim 11 wherein the cascode stage comprises:
a first MOS transistor having a first conduction node coupled to the first input node of the cascode stage, a second conduction node coupled to the first output node of the cascode stage, and a gate coupled to the bias node; and
a second MOS transistor having a first conduction node coupled to the second input node of the cascode stage, a second conduction node coupled to the second output node of the cascode stage, and a gate coupled to the bias node.

17. The level shifter of claim 11 wherein the cascode stage comprises:
a first NMOS transistor having a source coupled to the first input node of the cascode stage, a drain coupled to the first output node of the cascode stage, and a gate coupled to the bias node; and
a second NMOS transistor having a source coupled to the second input node of the cascode stage, a drain coupled to the second output node of the cascode stage, and a gate coupled to the bias node.

18. The level shifter of claim 11 wherein the output stage comprises:
a first transistor having a first conduction node coupled to the first differential node of the output stage, a second conduction node coupled to the supply node, and a control node coupled to the second differential node of the output stage; and
a second transistor having a first conduction node coupled to the second differential node of the output stage, a second conduction node coupled to the supply node, and a control node coupled to the first differential node of the output stage.

19. The level shifter of claim 11 wherein the output stage comprises:
a first MOS transistor having a first conduction node coupled to the first differential node of the output stage, a second conduction node coupled to the supply node, and a gate coupled to the second differential node of the output stage; and
a second MOS transistor having a first conduction node coupled to the second differential node of the output stage, a second conduction node coupled to the supply node, and a gate coupled to the first differential node of the output stage.

20. The level shifter of claim 11 wherein the output stage comprises:
a first PMOS transistor having a drain coupled to the first differential node of the output stage, a source coupled to the supply node, and a gate coupled to the second differential node of the output stage; and
a second PMOS transistor having a drain coupled to the second differential node of the output stage, a source coupled to the supply node, and a gate coupled to the first differential node of the output stage.

21. The level shifter of claim 11, further comprising:
a second input stage having first and second differential input nodes coupled to the first and second differential nodes of the first output stage, and having first and second differential output nodes;
a second cascode stage having first and second differential input nodes coupled to the first and second output nodes of the second input stage, having first and second differential output nodes, and having a second bias node; and
a second output stage having first and second differential nodes coupled to the first and second output nodes of the second cascode stage, having a second supply node, and operable to generate a differential output signal across the first and second differential nodes.

22. The level shifter of claim 11, wherein the first input stage further comprises a second transistor having a first conduction node coupled to the second input node, a second conduction node coupled to the second output node, and a control node coupled to the first input node.

23. An integrated circuit, comprising:
a level shifter, including
a first input stage having first and second differential input nodes, first and second differential output nodes, and a first transistor having a first conduction node electrically coupled to the first input node, a second conduction node coupled to the first output node, and a control node coupled to the second input node;
a cascode stage having first and second differential input nodes coupled to the first and second output nodes of the input stage, having first and second differential output nodes, and having a first bias nodes; and
an output stage having first and second differential nodes coupled to the first and second output nodes of the cascode stage, having a first supply node, and operable to generate a differential output signal across the first and second differential nodes.

24. A system, comprising:
an integrated circuit, including:
a level shifter, including:
a first input stage having first and second differential input nodes, first and second differential output nodes, and a first transistor having a first conduction node electrically coupled to the first input node, a second conduction node coupled to the first output node, and a control node coupled to the second input node;
a cascode stage having first and second differential input nodes coupled to the first and second output nodes of the input stage, having first and second differential output nodes, and having a first bias node; and an output stage having first and second differential nodes coupled to the first and second output nodes of the cascode stage, having a first supply node, and operable to generate a differential output signal across the first and second differential nodes, and a controller coupled to the integrated circuit.

25. The system of claim 24 wherein the integrated circuit comprises a memory circuit including:
a word line coupled to one of the first and second nodes of the output stage; and
a memory cell coupled to the word line.

26. The system of claim 24 wherein the integrated circuit comprises a memory circuit including:
a word line coupled to one of the first and second nodes of the output stage;
a row decoder coupled to the input node of the input stage; and
a nonvolatile memory cell coupled to the word line.

27. A method, comprising:
receiving first and second input voltages at first and second input nodes of a first input stage having a first branch coupled to the first and second input nodes and having a second branch coupled to the second input node;
electrically coupling the first voltage from the first input node to a first output node of the input stage with the first branch;
coupling the first voltage from the first output node to a first node of a first output stage having a supply node such that a first difference voltage between the first output node and the second input node of the input stage is less than or equal to a predetermined value;
generating on a second node of the output stage a third voltage such that a second difference voltage between the first node and the supply node of the output stage is less than or equal to the predetermined value, the third voltage being greater than a third difference voltage between the first and second voltages and less than or equal to substantially twice the third difference voltage.

28. The method of claim 27 wherein the predetermined value is substantially equal to the third difference voltage.

29. The method of claim 27 wherein coupling the first voltage from the first output node of the input stage to the first node of the output stage comprises cascoding the first voltage from the first output node to the first node.

30. The method of claim 27, further comprising:
receiving the third voltage and the first voltage at first and second input nodes of a second input stage;
coupling the third voltage from the first input node to a first output node of the second input stage;
coupling the third voltage from the first output node of the second input stage to a first node of a second output stage having a supply node such that a fourth difference voltage between the first output node and the second input node of the second input stage is less than or equal to the predetermined value; and
generating on a second node of the second output stage a fourth voltage such that a fifth difference voltage between the first node and the supply node of the second output stage is less than or equal to the predetermined value, the fourth voltage being greater than the third voltage and less than or equal to substantially three times the third difference voltage.

31. The method of claim 30 wherein coupling the third voltage from the first output node of the second input stage to the first node of the the second output stage comprises cascoding the third voltage from the first output node to the first node.

32. The method of claim 27 wherein the second branch is coupled to the first input node of the first input stage.

* * * * *